US012610793B2

(12) United States Patent
Chang et al.

(10) Patent No.: US 12,610,793 B2
(45) Date of Patent: Apr. 21, 2026

(54) METHOD OF MANUFACTURING MEMORY DEVICE

(71) Applicant: MACRONIX International Co., Ltd., Hsinchu (TW)

(72) Inventors: Hsun-Wei Chang, Hsinchu County (TW); Kuang-Wei Chen, Hsinchu City (TW); Tuung Luoh, Taipei City (TW); Ta-Hung Yang, Miaoli County (TW); Kuang-Chao Chen, Taipei City (TW)

(73) Assignee: MACRONIX International Co., Ltd., Hsinchu (TW)

( * ) Notice: Subject to any disclaimer, the term of this patent is extended or adjusted under 35 U.S.C. 154(b) by 476 days.

(21) Appl. No.: 18/471,294

(22) Filed: Sep. 21, 2023

(65) Prior Publication Data

US 2025/0105017 A1      Mar. 27, 2025

(51) Int. Cl.
| | |
|---|---|
| *H10P 95/00* | (2026.01) |
| *H10B 43/35* | (2023.01) |
| *H10W 10/00* | (2026.01) |
| *H10W 10/17* | (2026.01) |

(52) U.S. Cl.
CPC ........... *H10P 95/062* (2026.01); *H10B 43/35* (2023.02); *H10W 10/014* (2026.01); *H10W 10/17* (2026.01)

(58) Field of Classification Search
CPC ....... H10P 95/062; H10B 43/35; H10B 43/27; H10B 43/50; H10W 10/014; H10W 10/17
See application file for complete search history.

(56) References Cited

U.S. PATENT DOCUMENTS

| | | | | |
|---|---|---|---|---|
| 7,445,847 | B2 * | 11/2008 | Kulp ...................... | B24B 37/24 |
| | | | | 451/526 |
| 10,600,800 | B2 * | 3/2020 | Nishikawa ............. | H10B 43/10 |
| 2018/0350825 | A1 * | 12/2018 | Ogawa ................... | H10B 43/50 |
| 2019/0185714 | A1 * | 6/2019 | Penta ...................... | C09G 1/02 |
| 2020/0251487 | A1 * | 8/2020 | Tang ...................... | H10B 43/27 |
| 2021/0104472 | A1 * | 4/2021 | Shimamoto ......... | H10W 42/121 |
| 2022/0199416 | A1 * | 6/2022 | Zhou ..................... | H10P 95/062 |
| 2023/0016518 | A1 * | 1/2023 | Lien ...................... | G11C 16/24 |
| 2023/0027827 | A1 | 1/2023 | Lander | |

(Continued)

OTHER PUBLICATIONS

"Notice of Allowance of Taiwan Counterpart Application," issued on Feb. 27, 2024, pp. 1-6.

*Primary Examiner* — Joshua L Allen
*Assistant Examiner* — Christopher Remavege
(74) *Attorney, Agent, or Firm* — J.C. PATENTS

(57) ABSTRACT

A method of manufacturing a memory device at least includes the following steps. A first interconnect and a first dielectric layer are formed on a substrate. A first chemical mechanical polishing process is performed on the first dielectric layer. A stack structure is formed over the first dielectric layer and a staircase structure is formed in the stack structure. A second dielectric layer is formed on the substrate to cover the stack structure and the staircase structure. A second chemical mechanical polishing process is performed on the second dielectric layer. A depth of second grooves of a second polishing pad used in the second chemical mechanical polishing process is smaller than a depth of first grooves of a first polishing pad used in the first chemical mechanical polishing process. The memory device may be a 3D NAND flash memory with high capacity and high performance.

18 Claims, 15 Drawing Sheets

(56) References Cited

U.S. PATENT DOCUMENTS

| | | | |
|---|---|---|---|
| 2023/0066543 A1 | 3/2023 | Dai | |
| 2024/0315057 A1* | 9/2024 | Seo | H10B 80/00 |
| 2025/0019567 A1* | 1/2025 | Guo | C09G 1/02 |

* cited by examiner

METHOD OF MANUFACTURING MEMORY DEVICE

TECHNICAL FIELD

The disclosure relates to a manufacturing method of an integrated circuit, and in particular to a method of manufacturing a memory device.

DESCRIPTION OF RELATED ART

Since a non-volatile memory device (e.g., a flash memory) has the advantage that stored data does not disappear at power-off, it becomes a widely used memory device for a personal computer or other electronics equipment.

Currently, the flash memory array commonly used in the industry includes a NOR flash memory and a NAND flash memory. Since the NAND flash memory has a structure in which memory cells are connected together in series, degree of integration and area utilization thereof are better than those of the NOR flash memory. Thus, the NAND flash memory has been widely used in a variety of electronic products. Besides, to further enhance the degree of integration of the memory device, a three-dimensional NAND flash memory is developed. However, there are still some challenges associated with the three-dimensional NAND flash memory. For example, during the chemical mechanical polishing process of the dielectric layer on the staircase structure, the groove plugging of the polishing pad is often caused, causing the process to be interrupted, and even causing problems such as reduction of the life of the polishing pad.

SUMMARY

The disclosure provides a method of manufacturing a memory device, which may reduce the groove plugging of the polishing pad, so that the usage time and life of the polishing pad may be extended.

According to the embodiment of the disclosure, a method of manufacturing a memory device at least includes the following steps. A first interconnect is formed on a substrate. A first dielectric layer is formed on the first interconnect. A first chemical mechanical polishing process is performed on the first dielectric layer. A stack structure is formed over the first dielectric layer. A staircase structure is formed in the stack structure. A second dielectric layer is formed on the substrate to cover the stack structure and the staircase structure. A second chemical mechanical polishing process is performed on the second dielectric layer. A depth of second grooves of a second polishing pad used in the second chemical mechanical polishing process is smaller than a depth of first grooves of a first polishing pad used in the first chemical mechanical polishing process.

Based on the above, in the embodiment of the disclosure, the method of manufacturing the memory device uses a polishing pad with a shallower groove to extend the life of the polishing pad.

DESCRIPTION OF THE EMBODIMENTS

The disclosure provides a chemical mechanical polishing process that enables the polishing pad to maintain sufficient groove depth under a long-term use, so that the chemical mechanical polishing process may maintain a relatively high removal rate.

The chemical mechanical polishing process of the disclosure may be used for the planarization process of a surface of a dielectric layer with a large height difference, such as the dielectric layer on the staircase structure of the 3D flash memory. However, the disclosure is not limited thereto.

Figure 1A:
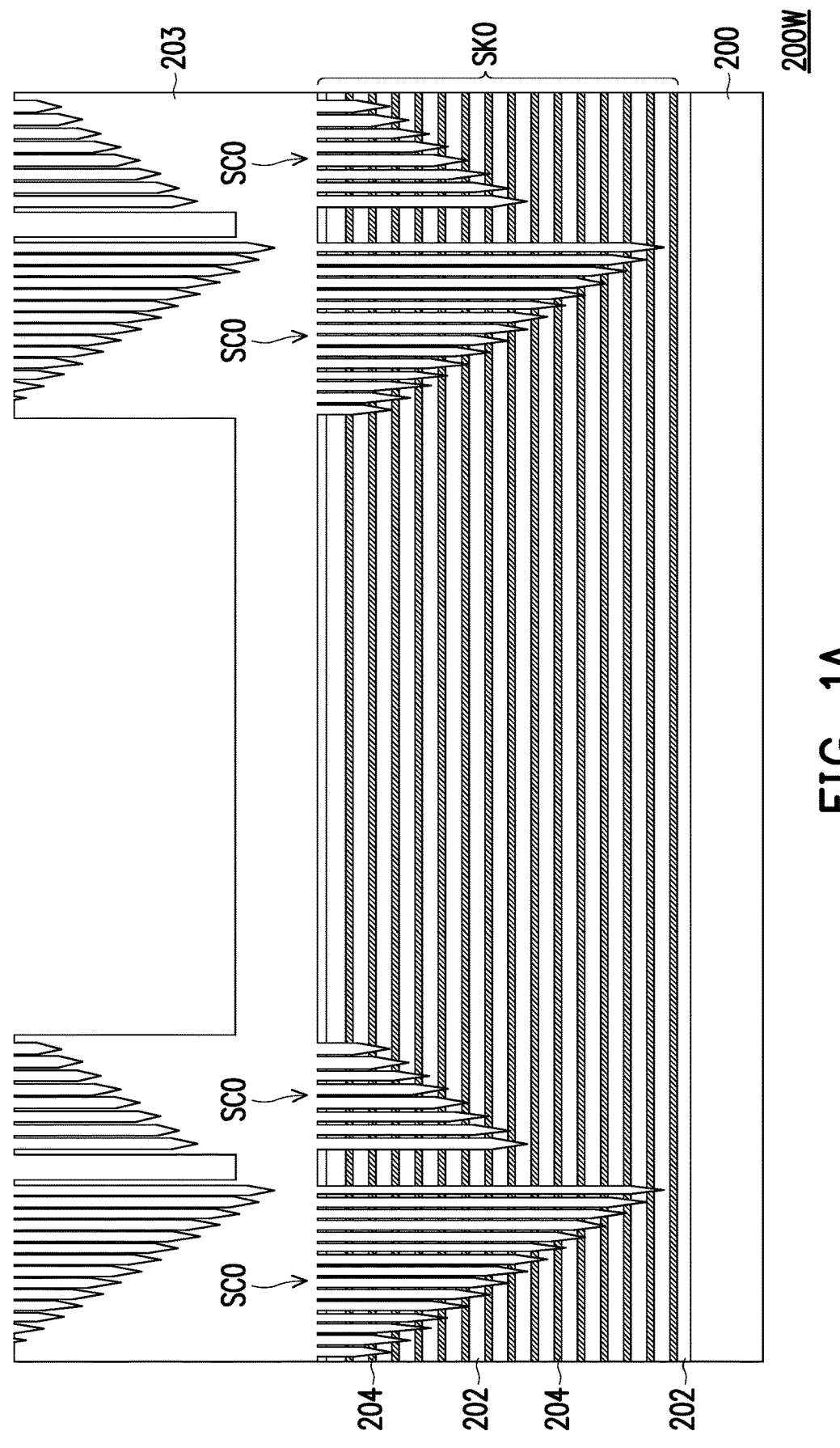
FIG. 1A and FIG. 1B are schematic cross-sectional views of intermediate stages of a method of manufacturing a three dimensional memory device according to the embodiment of the disclosure.
Figure 1B:
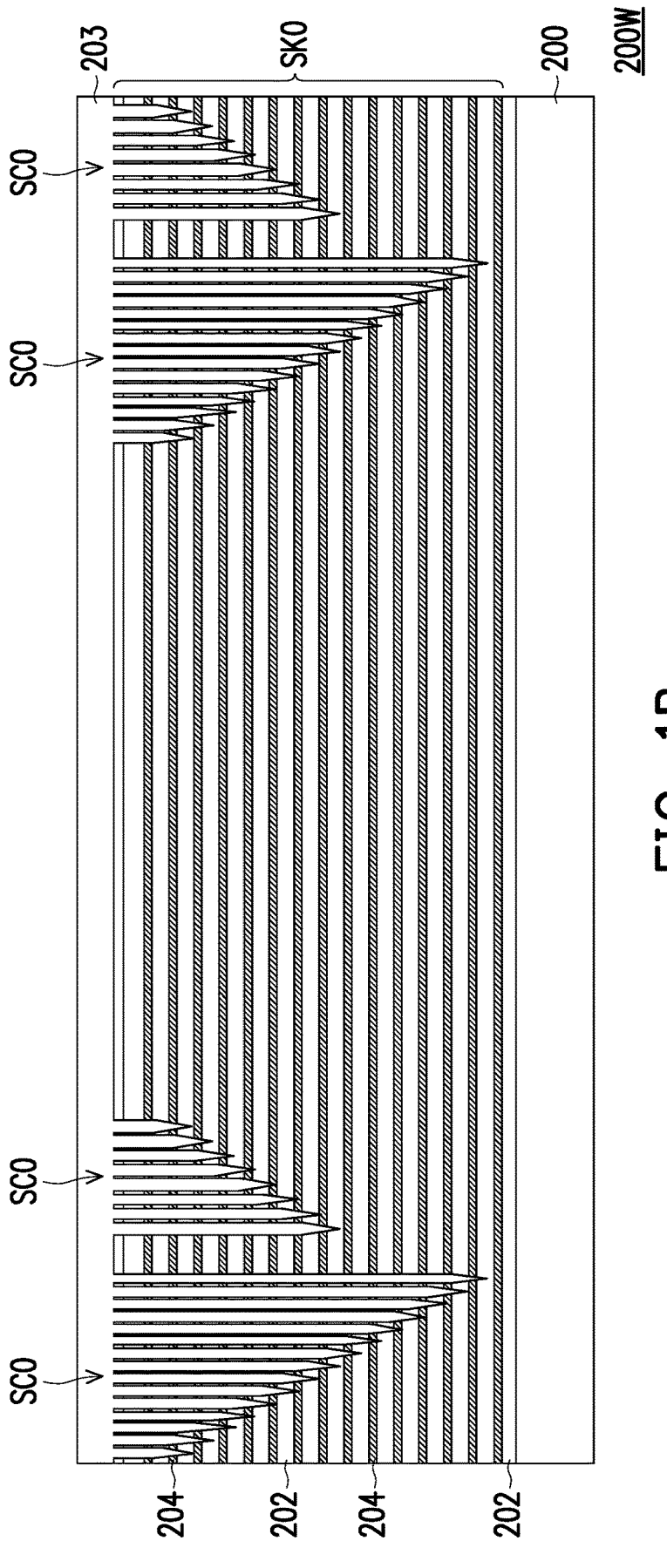
Figures 2A, 2B, 3A, 3B:
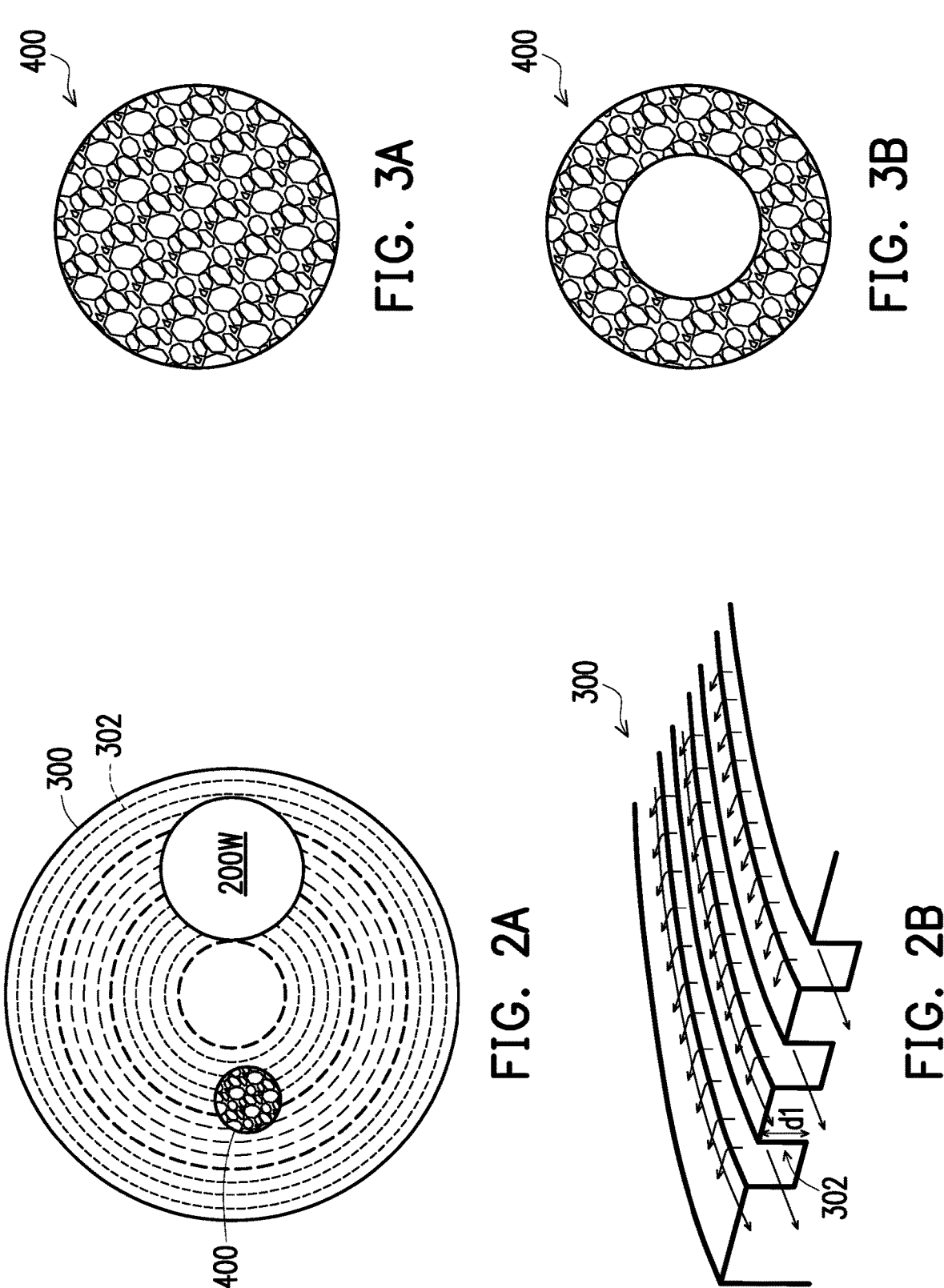
FIG. 2A and FIG. 2B are a top view and a partial perspective view of a polishing pad used in a chemical mechanical polishing process according to the embodiment of the disclosure.
FIG. 3A and FIG. 3B are respectively a top view of a dresser used in a chemical mechanical polishing process according to the embodiment of the disclosure.

FIG. 1A and FIG. 1B are schematic cross-sectional views of intermediate stages of a method of manufacturing a three dimensional memory device according to the embodiment of the disclosure. FIG. 2A and FIG. 2B are a top view and a partial perspective view of a polishing pad used in a chemical mechanical polishing process according to the embodiment of the disclosure. FIG. 3A and FIG. 3B are respectively a top view of a dresser used in a chemical mechanical polishing process according to the embodiment of the disclosure.

Referring to FIG. 1A, a wafer 200W may include a substrate 200 and a stack structure SK0. The substrate 200 may be a semiconductor substrate, such as a silicon-containing substrate. The stack structure SK0 may include a plurality of insulating layers 202 and a plurality of middle layers 104 stacked alternately. The material of the insulating layer 202 includes silicon oxide, and the material of the middle layer 204 includes silicon nitride. The stack structure SK0 has been formed into a plurality of staircase structures SC0 by a patterning process. In addition, a dielectric layer 203 has been formed on the stack structure SK0. Since the staircase structure SC0 has so many steps, such as more than 100 steps, the height difference of the surface of the staircase structure SC0 is relatively large. Therefore, the surface of the dielectric layer 203 also has dramatic variations in topology.

Referring to FIG. 1B and FIG. 2A, a planarization process is performed on the dielectric layer 203 to remove excess dielectric layer 203. At this stage of the manufacturing process, in order to planarize the dielectric layer 203, the embodiment of the disclosure adopts a chemical mechanical polishing (CMP) process different from CMP processes used in other stages. Referring to FIGS. 2A and 2B, the CMP process of the embodiment of the disclosure uses a polishing pad 300 with higher hardness (that is, more solid) and lower roughness. The depth d1 of the groove 302 of the polishing pad 300 is shallower, for example, less than 30 mil. The polishing pad 300 also has relatively low porosity, e.g., 0 to 30%.

Referring to FIGS. 2A, 3A and 3B, the dresser 400 used in the CMP process may have a circular or donut-shaped profile, as shown in FIGS. 3A and 3B respectively. The dresser 400 has a relatively high removal rate, for example, 300-600 microns/hour. The concentration of the abrasive particles of the slurry used in the CMP process is relatively low, for example, less than 15%. The abrasive particles include silicon oxide, aluminum oxide, cerium oxide or combinations thereof.

Figure 4:
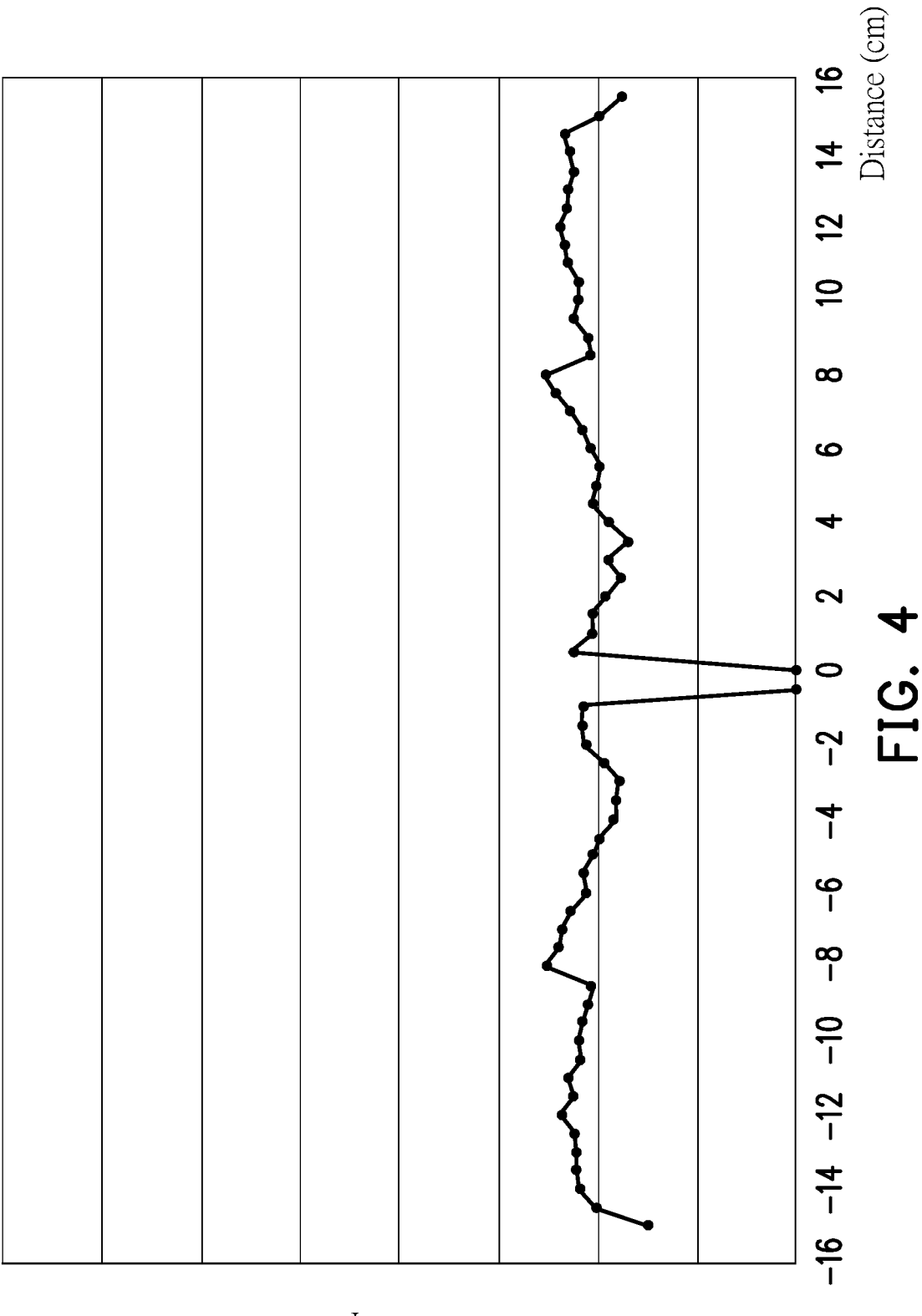
FIG. 4 shows a groove depth of a polishing pad used in a chemical mechanical polishing process after a long period of grinding according to the embodiment of the disclosure.
Figure 5:
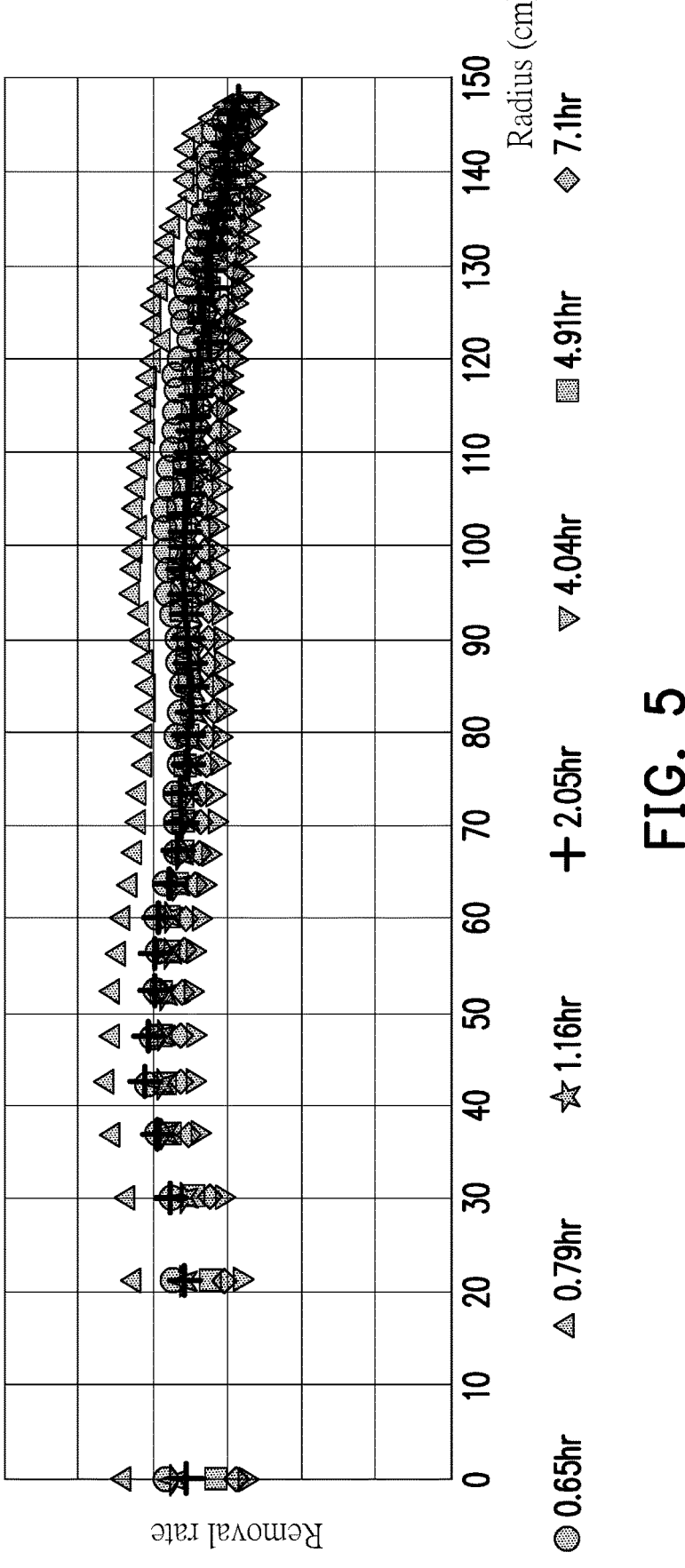
FIG. 5 shows the removal rate of the dielectric layer at various radial positions of the wafer along with the use time of the polishing pad during the chemical mechanical polishing process according to the embodiment of the present disclosure.

FIG. 4 shows a groove depth of a polishing pad used in a chemical mechanical polishing process after a long period (9 hours) of grinding according to the embodiment of the disclosure. FIG. 5 shows removal rates of dielectric layer at various radial positions of a wafer along with the use time of a polishing pad used during a chemical mechanical polishing process according to the embodiment of the disclosure.

As shown in FIG. 4, after a long period (9 hours) of grinding, the grooves at various positions of the polishing pad still have sufficient depth.

As shown in FIG. 5, after a long period (9 hours) of grinding, the chemical mechanical polishing process still has relatively high removal rates remove a dielectric layer at various radial positions of the wafer The CMP process of the embodiment of the disclosure may efficiently remove the dielectric layer through the design of the polishing pad, the combination of the material and concentration of the abrasive particles of the slurry, the selection of the profile of the dresser, and the control of the removal rate. In addition, the polishing pad may still maintain sufficient groove depth under a long-term use, so that the chemical mechanical polishing process may maintain a relatively high removal rate.

Compared with the polishing pads used in other CMP processes, the CMP process of the embodiment of the disclosure uses the polishing pads with higher hardness, lower roughness, shallower groove depth and lower porosity, the slurry with lower concentration of the abrasive particles and the dresser with a higher removal rate. This will be described in detail below with reference to FIGS. 6A to 6J. FIG. 6A to FIG. 6J are schematic cross-sectional views of a manufacturing method of a three dimensional memory device according to the embodiment of the disclosure.

Figure 6A:
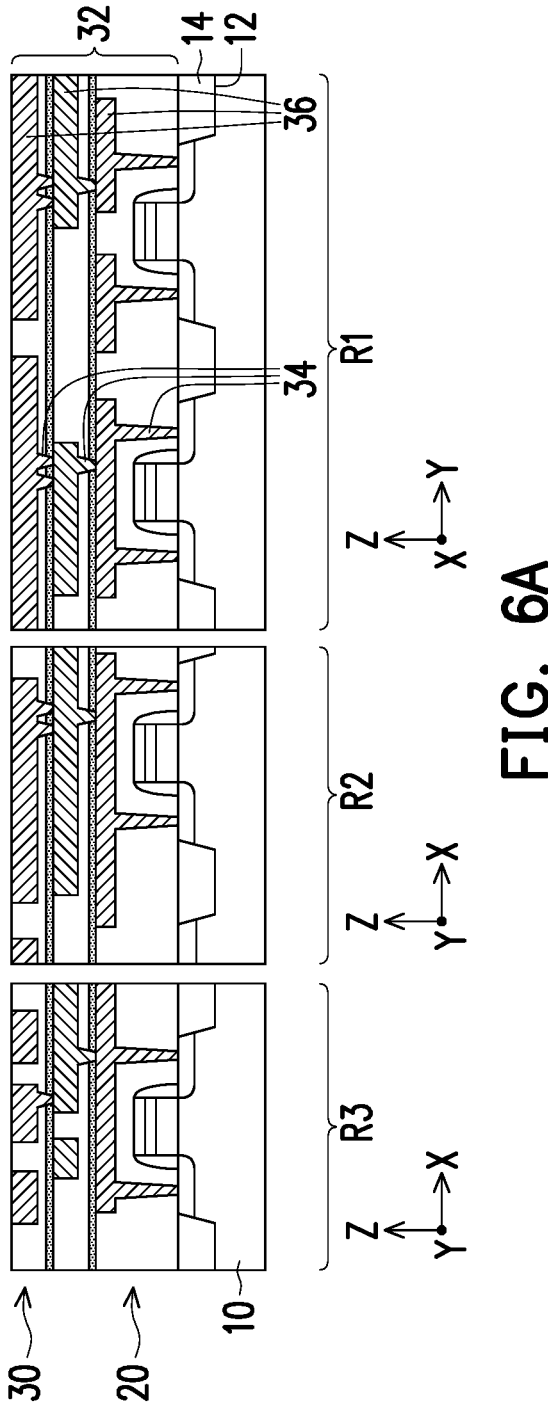
FIG. 6A to FIG. 6J are schematic cross-sectional views of a manufacturing method of a three dimensional memory device according to the embodiment of the disclosure.

Referring to FIG. 6A, a substrate 10 is provided. The substrate 10 includes a first region R1, a second region R2, and a third region R3. The first region R1, the second region R2, and the third region R3 may also be referred to as a memory array region R1, a staircase region R2, and a periphery region R3. The substrate 10 may be a semiconductor substrate, such as a silicon-containing substrate. The first region R1 is a schematic cross-sectional view along the Y direction, and the second region R2 and the third region R3 are schematic cross-sectional views along the X direction.

A plurality of shallow trench isolation structures 14 are formed in the substrate 10. The formation method of the shallow trench isolation structures 14 is, for example, forming a plurality of trenches 12 in the substrate 10, and then forming an insulating layer above the substrate 10 and in the trenches 12. Afterwards, a CMP process (referred to as CMP4) is performed to remove the excess insulating layer above the substrate 10.

Then, a device layer 20 is formed on the substrate 10. The device layer 20 may include an active device or a passive device. The active device is, for example, a transistor and a diode. The passive device is, for example, a capacitor and an inductor. The transistor may be an N-type metal-oxide-semiconductor (NMOS) transistor, a P-type metal-oxide-semiconductor (PMOS) transistor, or a complementary metal-oxide-semiconductor (CMOS).

An interconnect structure 30 is formed on the device layer 20. The interconnect structure 30 may include a plurality of dielectric layers 32 and a metal interconnect 33 formed in the dielectric layers 32. The metal interconnect 33 includes a plurality of plugs 34, a plurality of conductive lines 36 and so on. The dielectric layer 32 separates adjacent conductive lines 36. The conductive lines 36 may be connected to each other through the plug 34, and the conductive lines 36 may be connected to the device layer 20 through the plugs 34. Any one of the dielectric layers 32 may be processed by a CMP process (referred to as CMP1) to have a flat surface.

Figure 6B:
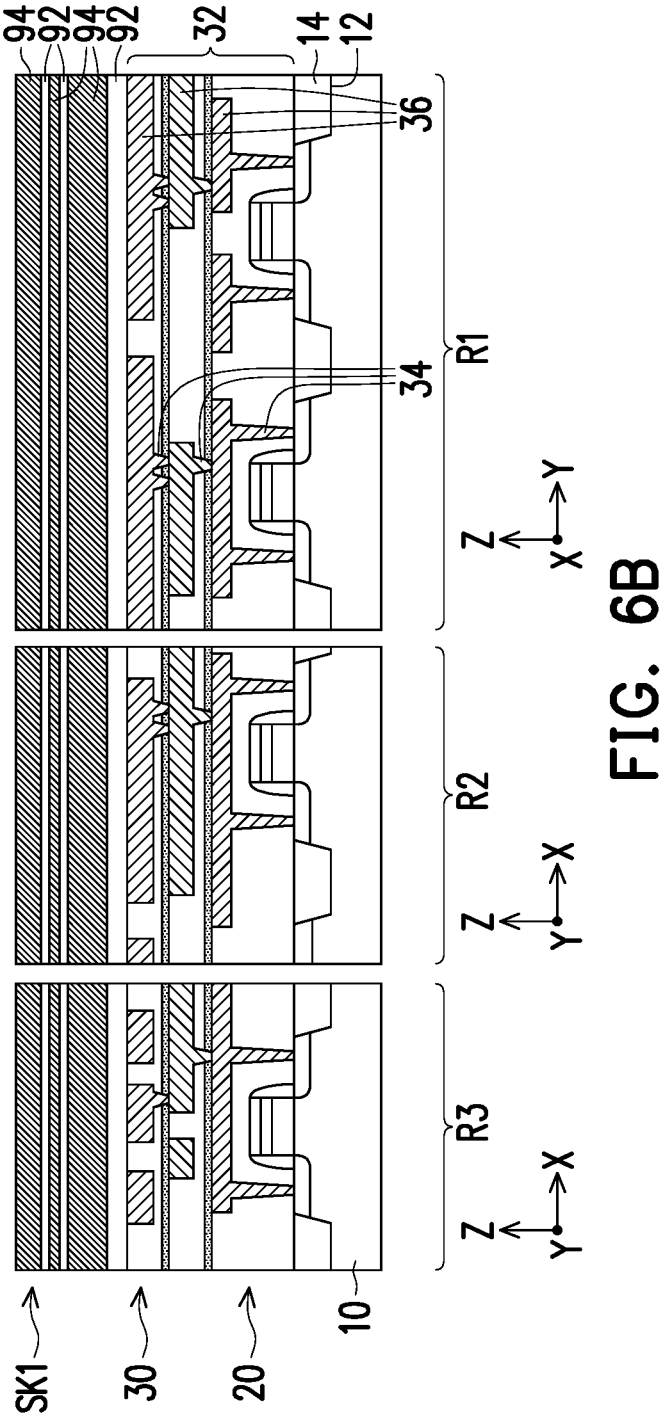

Referring to FIG. 6B, a stack structure SK1 is formed on the interconnect structure 30. The stack structure SK1 includes a plurality of insulating layers 92 and a plurality of conductive layers 94 stacked alternately along the Z direction. Since a memory array will be formed right above the stack structure SK1 in the first region R1, and the device layer 20 is, for example, a complementary metal-oxide-semiconductor (CMOS) formed below the memory array, this architecture may also be referred to as a CMOS-Under-Array (CUA) structure.

Figure 6C:
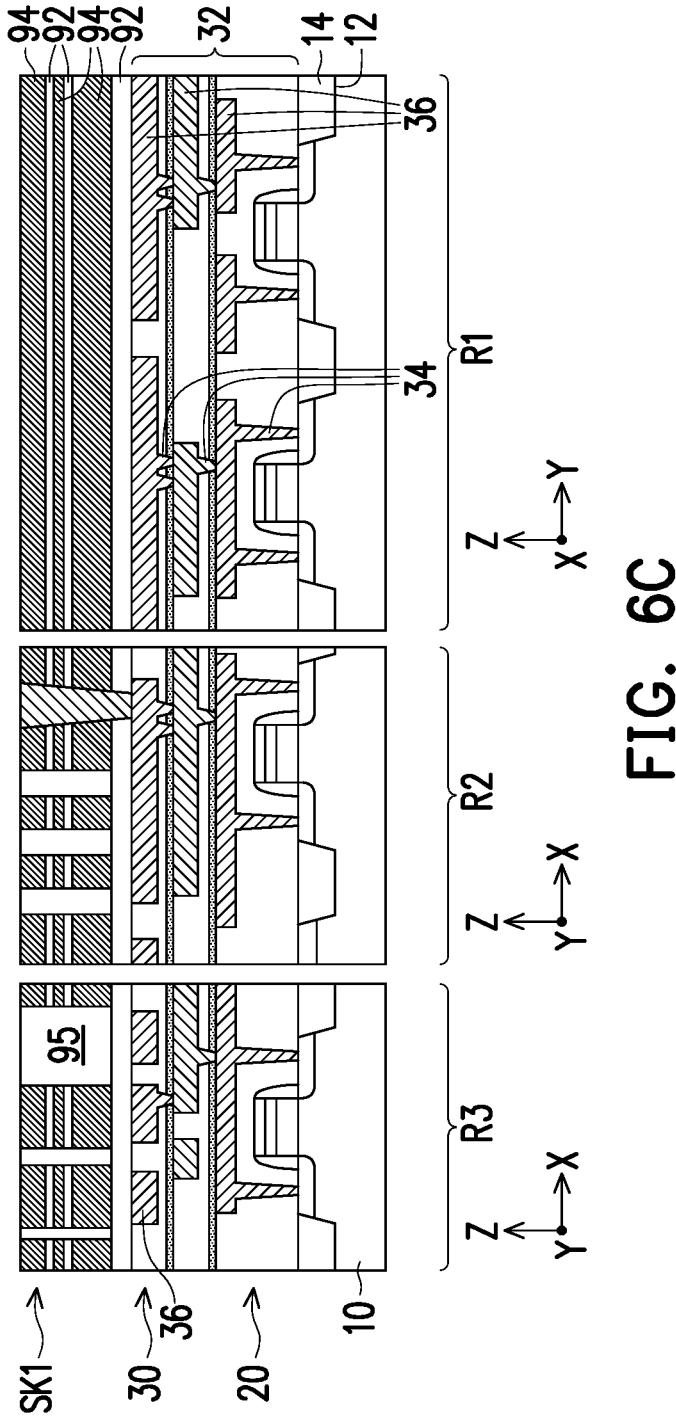

Referring to FIG. 6C, the stack structure SK1 is patterned to form a plurality of openings (not shown). Then, a plurality of insulating structures 95 are formed in the openings by filling an insulating material (such as silicon oxide) in the openings and performing a CMP process (referred to as CMP5) to remove excess insulating material.

Figure 6D:
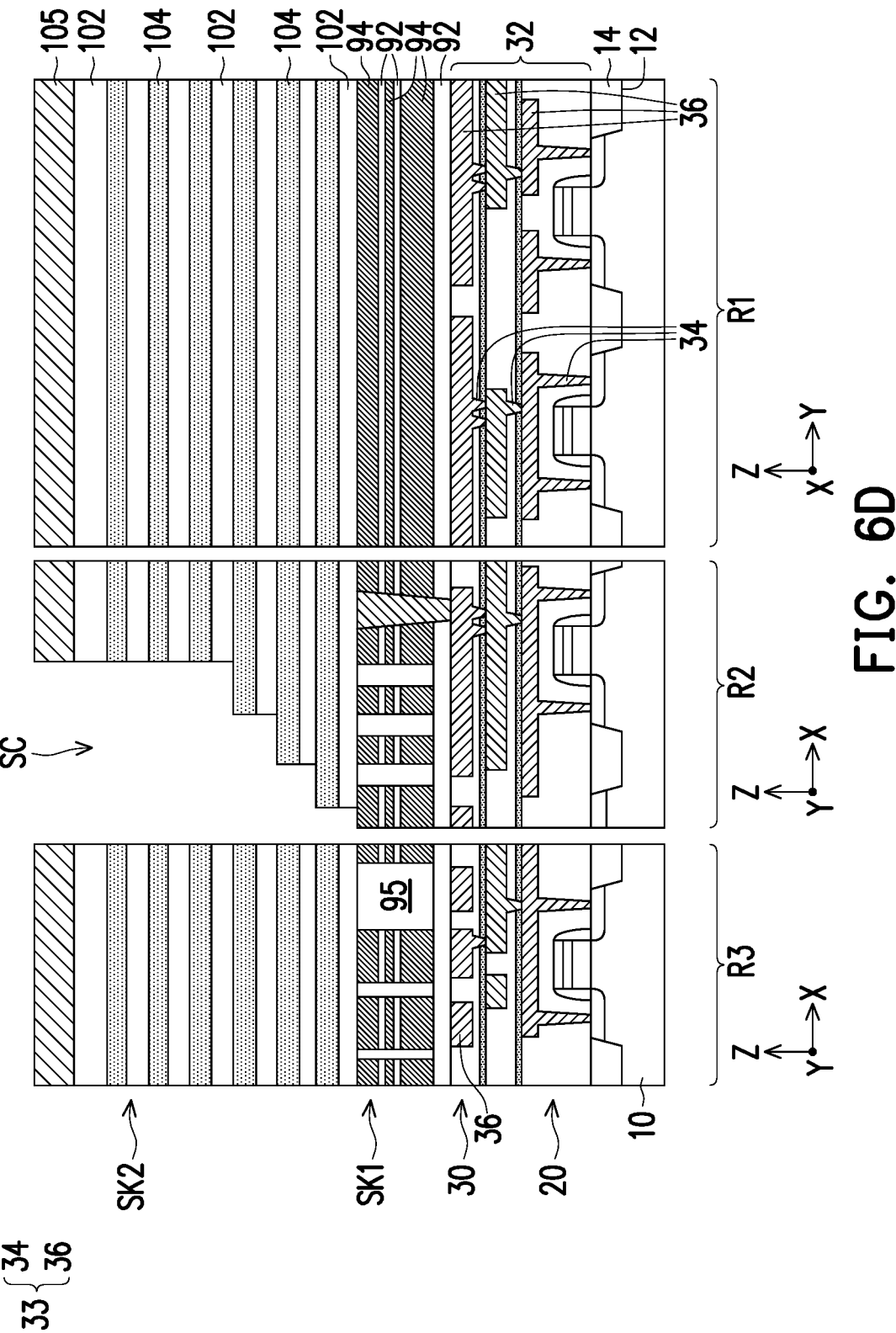

Referring to FIG. 6D, a stack structure SK2 is formed above the substrate 10. The stack structure SK2 includes a plurality of insulating layers 102 and a plurality of middle layers 104 stacked alternately. In an embodiment, the material of the insulating layer 102 includes silicon oxide, and the material of the middle layer 104 includes silicon nitride. The middle layers 104 may serve as sacrificial layers and may be partially removed or completely removed in the subsequent processes. Then, a stop layer 105 is formed on the stack structure SK2. The material of the stop layer 105 is different from the materials of the insulating layer 102 and the middle layer 104, and is, for example, polysilicon. Next, the middle layers 104 and the insulating layers 102 of the stack structure SK2 in the second area R2 are patterned to form a staircase structure SC.

Figure 6E:
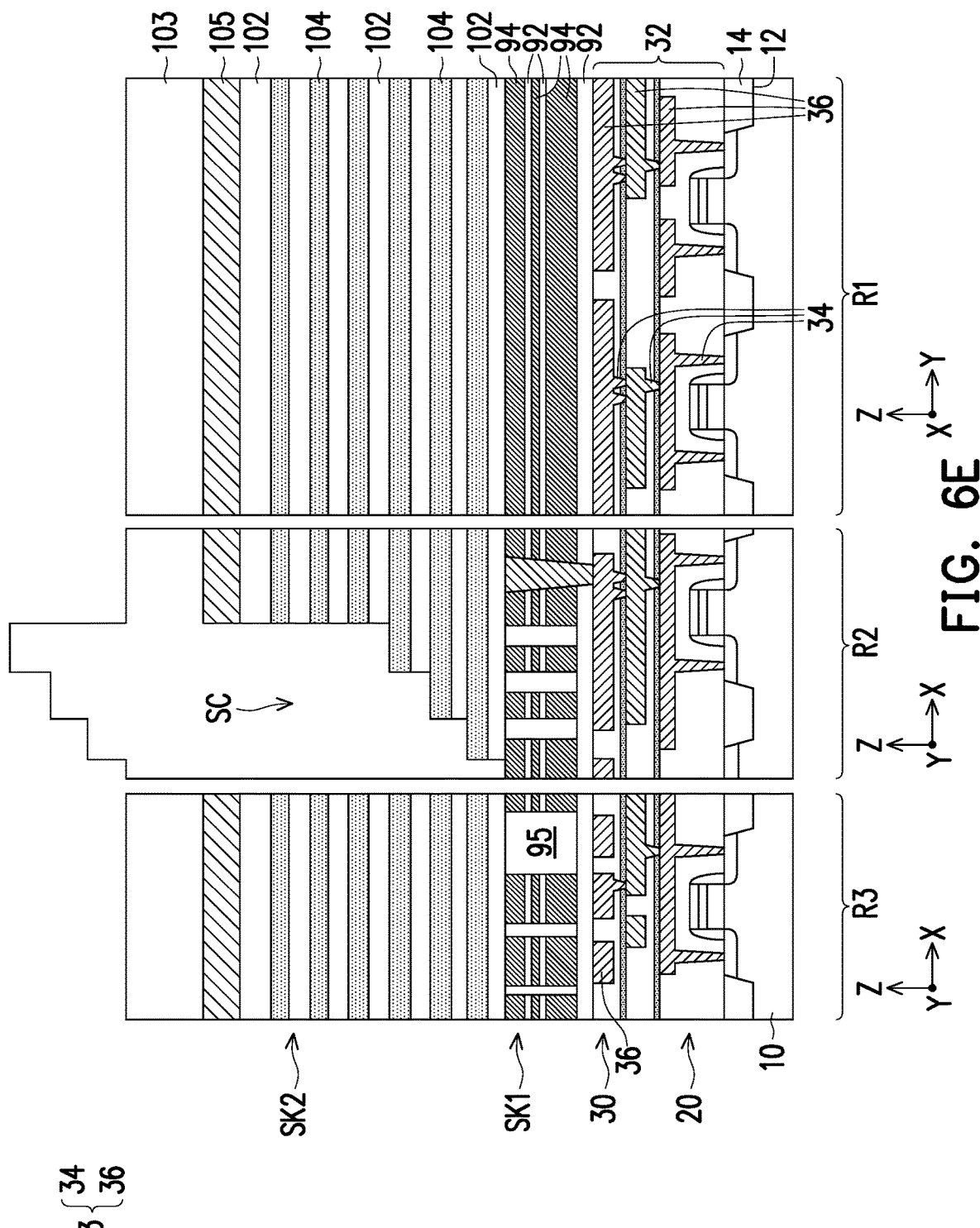

Referring to FIG. 6E, a dielectric layer 103 is formed above the substrate 10 to cover the staircase structure SC. The material of the dielectric layer 103 is, for example, silicon oxide. The dielectric layer 103 is formed by, for example, forming a dielectric material layer to cover the staircase structure SC. The dielectric layer 103 is, for example, silicon oxide formed by plasma-enhanced chemical vapor deposition using tetraethylsiloxane as a precursor. Since the staircase structure SC has a plurality of steps, the height difference of the surface of the staircase structure SC is large. Therefore, the surface of the dielectric layer 103 has relatively large variations in topology.

Figure 6F:
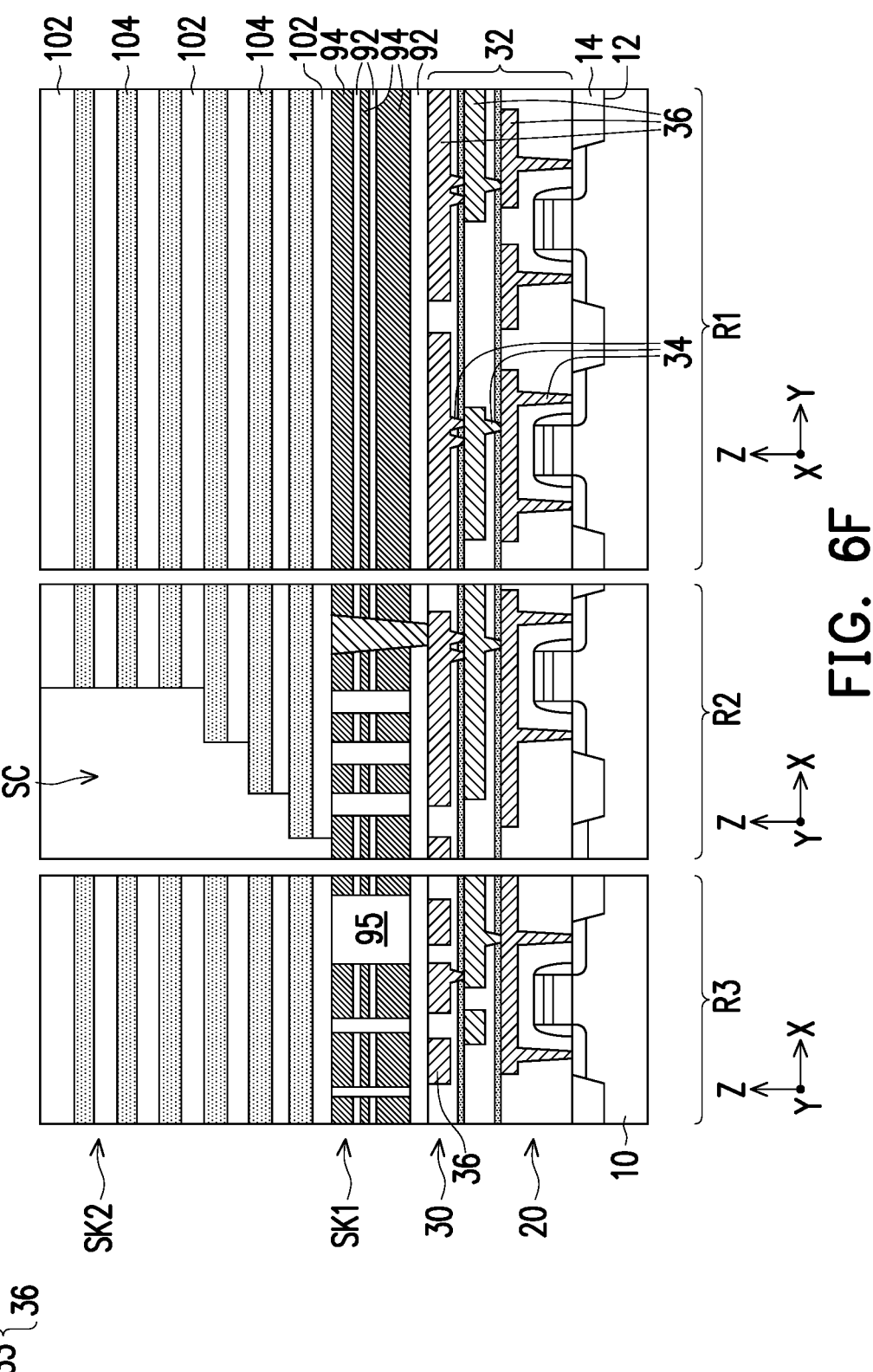

Referring to FIG. 6F, then, by using the stop layer 105 as a polishing stop layer, a planarization process such as a CMP process (referred to as CMP2) is performed to remove the dielectric layer 103 above the stop layer 105. The CMP process CMP2 of the embodiment of the disclosure uses a polishing pad with higher hardness and lower roughness. In the embodiment of the disclosure, a groove depth of the polishing pad is less than 30 mil. The porosity of the polishing pad ranges from 0 to 30%. The dresser used in the CMP process CMP2 may have a circular or donut-shaped profile. The dresser of the CMP process CMP2 has a higher removal rate, such as 300-600 microns/hour. The concentration of the abrasive particles of the slurry used in the CMP process CMP2 is lower, for example, less than 15%. The abrasive particles include silicon oxide, aluminum oxide, cerium oxide or combinations thereof. After that, the stop layer 105 is removed.

Figure 6G:
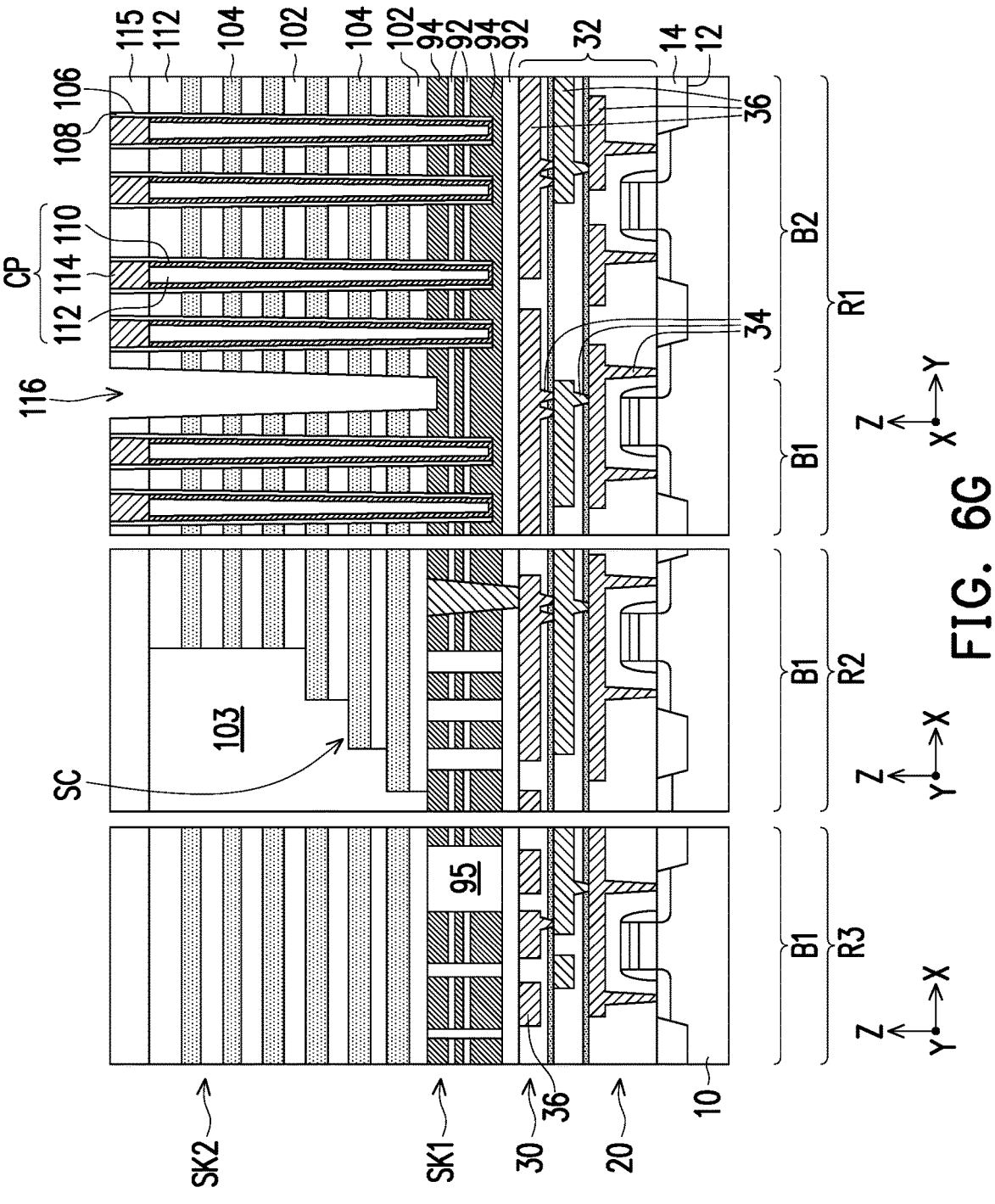

Referring to FIG. 6G, an insulating cap layer 115 is formed on the stack structure SK2. In an embodiment, the material of the insulating cap layer 115 includes silicon oxide. Then, a patterning process is performed to form one or more openings 106 passing through the insulating cap layer 115, the stack structure SK2 and the stack structure SK1. In an embodiment, the opening 106 is also referred to as a vertical channel (VC) opening. After that, a charge storage structure 108 is formed in the opening 106. The charge storage structure 108 is in contact with the insulating cap layer 115, the insulating layers 102, the middle layers 104, the insulating layers 92, and the conductive layers 94. In an embodiment, the charge storage structure 108 is an oxide/nitride/oxide (ONO) composite layer. Then, a channel layer 110, an insulating pillar 112 and a conductive plug 114 are formed on the charge storage structure 108 to form a vertical channel pillar CP. The material of the channel layer 110 and the conductive plug 114 includes polycrystalline silicon. The material of the insulating pillar 112 includes silicon oxide. The conductive plug 114 is in contact with the channel layer 110. The charge storage structure 108 surrounds the outer surface of the vertical channel pillar CP.

Referring to FIG. 6G again, a patterning process is performed on the stack structure SK2 to form a plurality of slit trenches 116. The slit trench 116 extends in the X direction and passes through the insulating cap layer 115 and the stack structure SK2 to divide the stack structure SK2 into a plurality of blocks B (e.g., a block B1 and a block B2). The slit trench 116 exposes the sidewalls of the insulating cap layer 115, the middle layers 104, and the insulating layers 102.

Figure 6H:
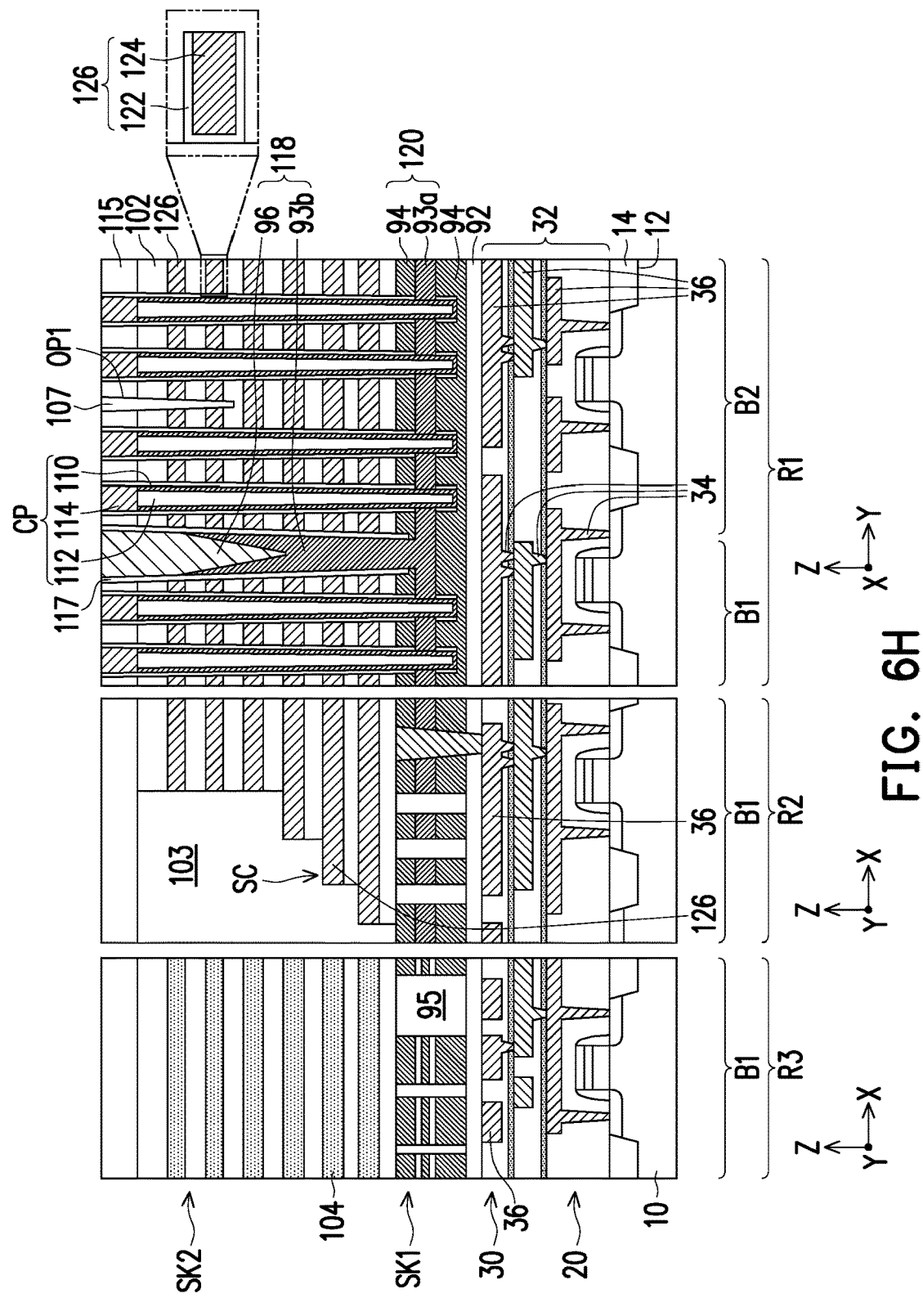

Referring to FIG. 6H, afterwards, a replacement process is performed to replace the middle layers 104 in the first region R1 and the second region R2 with conductive layers 126. The conductive layer 126 includes, for example, a barrier layer 122 and a metal layer 124. In an embodiment, the material of the barrier layer 122 includes titanium (Ti), titanium nitride (TiN), tantalum (Ta), tantalum nitride (TaN), or a combination thereof, and the material of the metal layer 124 includes tungsten (W).

Next, a spacer 117 is formed on the sidewall of the trench 116. The spacer 117 includes a dielectric material different from the material of the insulating layer 102, and may be, for example, silicon nitride or a silicon oxide/silicon nitride/silicon oxide composite layer. Afterwards, the depth of the trench 116 is increased, and a middle one of the conductive layers 94 and the insulating layer 92 thereabove and thereabelow are removed. Then, conductive layers 93a, 93b and a conductive pad 96 are formed. The conductive layers 93a and 93b are, for example, doped polycrystalline silicon layers. The material of the conductive pad 96 is, for example, tungsten. The conductive layer 93a and the conductive layers 94 thereabove and thereabelow together form a source line 120. The source line 120 may also be referred to as a common source conductive layer 120. The conductive pad 96 and the conductive layer 93b in the trench 116 collectively form a source line slit 118 for conducting a current from the source line 120. The source line slit 118 is insulated by the spacer 117 to avoid being in contact with the conductive layers 126.

Referring to FIG. 6H, a selective source line cut slit 107 extending in the X direction is formed in part of the insulating cap layer 115 and part of the stack structure SK2 of each block B. The selective source line cut slit 107 is an insulating material such as silicon oxide and separates the upper conductive layers 126 of the stack structure SK2 of each block B from each other. The formation method of the selective source line cut slit 107 includes forming a plurality of trenches OP1 in the insulating cap layer 115 and part of the stack structure SK2, forming an insulating material on the insulating cap layer 115, and then performing a CMP process (referred to as CMP6) to remove excess insulating material on the insulating cap layer 115. The timing of forming the selective source line cut slit 107 is not limited thereto, and the selective source line cut slit 107 may also be formed in advance, for example, before the staircase structure SC is formed.

Figure 6I:
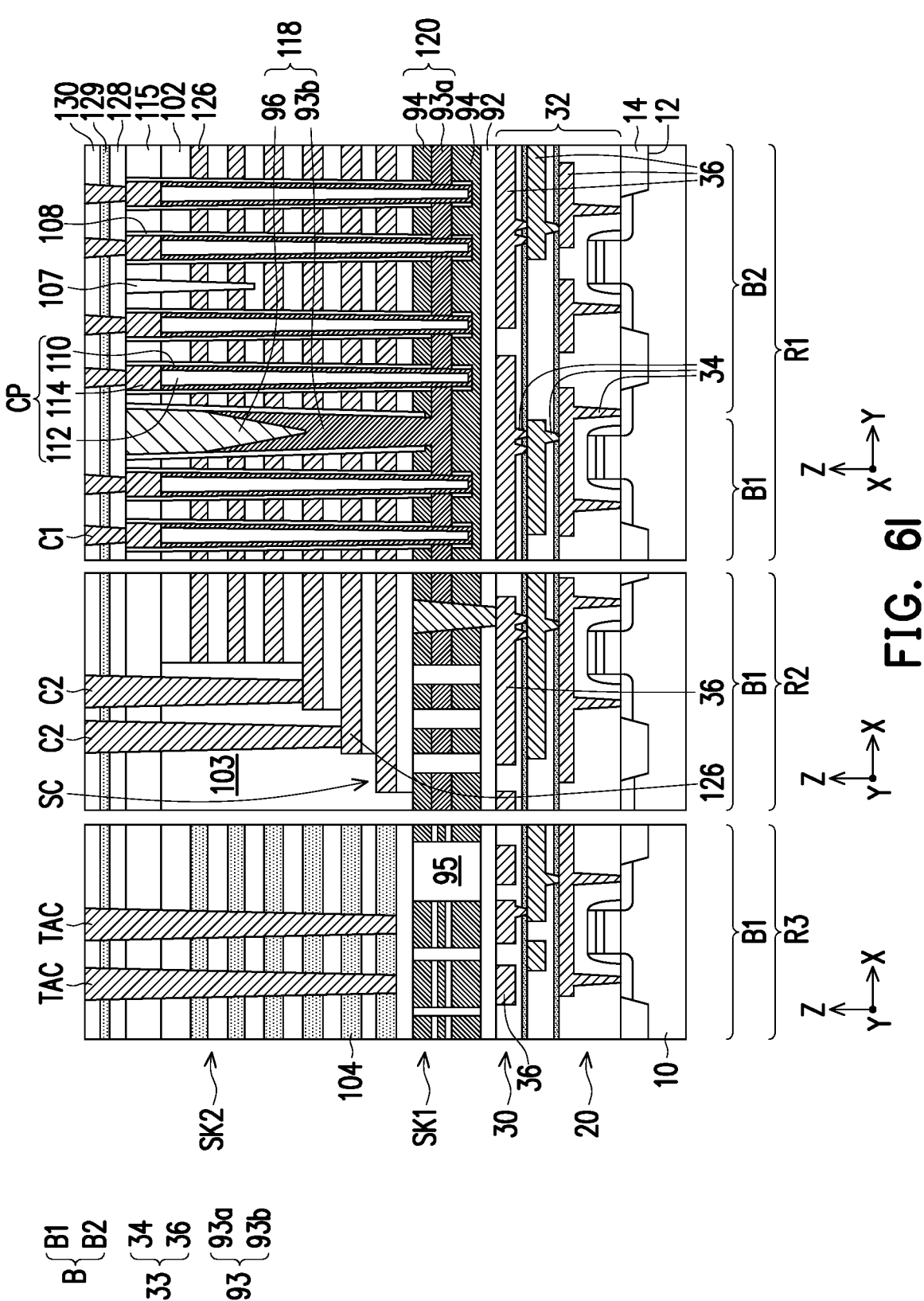

Referring to FIG. 6I, next, a dielectric layer 128, a stop layer 129, and a dielectric layer 130 are formed on the insulating cap layer 115. The dielectric layers 128 and 130 are, for example, silicon oxide, and the stop layer 129 is, for example, silicon nitride. Afterwards, lithography and etching processes are performed to form contacts C1, C2 and TAC respectively in the first region R1, the second region R2, and the third region R3. The contact C1 lands on the conductive plug 114 of the vertical channel pillar CP and is electrically connected to the conductive plug 114. The contact C2 passes through the dielectric layer 103, lands on the surface of the end of the conductive layer 126 of the staircase structure SC, and is electrically connected to the conductive layer 126. The contact TAC may also be referred to as a through array contact. The contact TAC passes from the dielectric layer 130, through the insulating cap layer 115 and the stack structures SK2 and SK1 and lands on the interconnect structure 30, and is electrically connected to the conductive line 36.

Figure 6J:
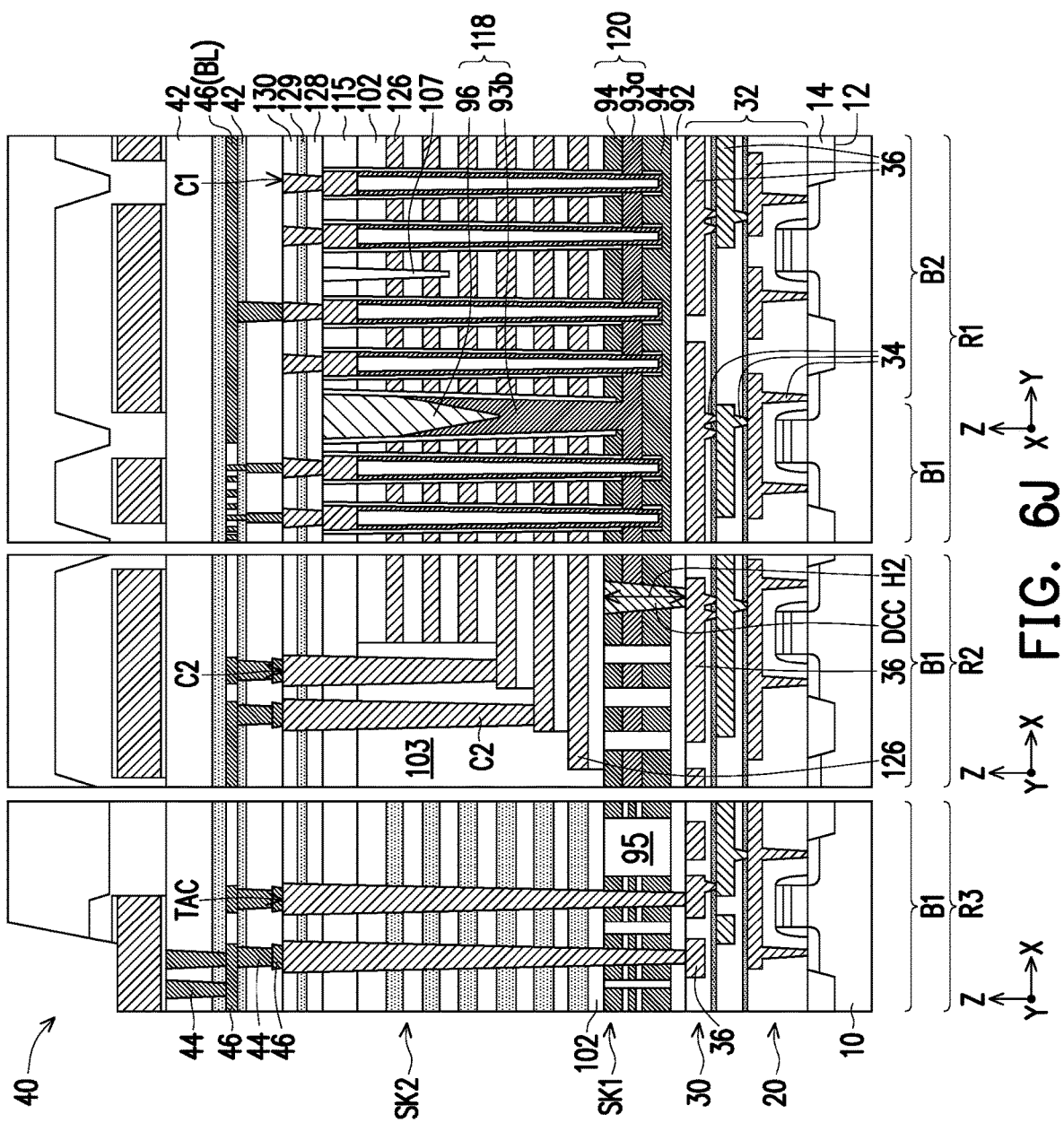

Referring to FIG. 6J, an interconnect structure 40 is formed. The interconnect structure 40 may include a plurality of dielectric layers 42 and a plurality of plugs 44, a plurality of conductive lines 46 and so on formed in the dielectric layers 42. The dielectric layer 42 separates adjacent conductive lines 46. The conductive lines 46 may be connected to each other through the plug 44, and the conductive lines 46 may be respectively electrically connected to the contacts C1, C2, and TAC. The conductive line 46 connected to the contact C1 may serve as a bit line BL. Any one of the dielectric layers 42 may be processed by a CMP process (referred to as CMP3) to have a flat surface.

Afterwards, subsequent fabrication processes are performed to complete the fabrication of the memory device.

The polishing pad used in the CMP process CMP2 of the embodiment of the disclosure has higher hardness. The hardness of the polishing pad used in the CMP process CMP2 is higher than the hardness of the polishing pad respectively used in the CMP processes CMP1, CMP3, CMP4, CMP5 and CMP6.

The polishing pad used in the CMP process CMP2 of the embodiment of the disclosure has lower roughness. The roughness of the polishing pad used in the CMP process CMP2 is lower than the roughness of the polishing pad respectively used in the CMP processes CMP1, CMP3, CMP4, CMP5 and CMP6.

The polishing pad used in the CMP process CMP2 of the embodiment of the disclosure has shallower groove depth. The depth of the groove of the polishing pad used in the CMP process CMP2 is smaller than the depth of the groove of the polishing pad respectively used in the CMP processes CMP1, CMP3, CMP4, CMP5 and CMP6.

The polishing pad used in the CMP process CMP2 has lower porosity. The porosity of the polishing pad used in the CMP process CMP2 is lower than the porosity of the polishing pad respectively used in the CMP processes CMP1, CMP3, CMP4, CMP5 and CMP6.

The dress used in the CMP process CMP2 has a higher removal rate. The removal rate of the dresser used in the CMP process CMP2 is higher than the removal rate of the dresser respectively used in the CMP processes CMP1, CMP3, CMP4, CMP5 and CMP6.

The slurry used in the CMP process CMP2 has lower concentration of the abrasive particles. The concentration of the abrasive particles used in the CMP process CMP2 is lower than the concentration of the abrasive particles respectively used in the CMP processes CMP1, CMP3, CMP4, CMP5 and CMP6.

The CMP process CMP2 of the embodiment of the disclosure uses the polishing pad with higher hardness, lower roughness, shallower groove depth and lower porosity in combination with the slurry with lower concentration of the abrasive particles and the dresser with a higher removal rate. The groove plugging of the polishing pad may be reduced and the use time and life of the polishing pad may be extended.

What is claimed is:

1. A method of manufacturing a memory device, comprising:
    forming a first interconnect on a substrate;
    forming a first dielectric layer on the first interconnect;
    performing a first chemical mechanical polishing process on the first dielectric layer;
    forming a stack structure above the first dielectric layer;
    forming a staircase structure in the stack structure;
    forming a second dielectric layer on the substrate, to cover the stack structure and the staircase structure; and
    performing a second chemical mechanical polishing process on the second dielectric layer,
    wherein a depth of second grooves of a second polishing pad used in the second chemical mechanical polishing process is smaller than a depth of first grooves of a first polishing pad used in the first chemical mechanical polishing process.

2. The method of claim 1, wherein a porosity of the second polishing pad is lower than a porosity of the first polishing pad.

3. The method of claim 1, wherein a hardness of the second polishing pad is higher than a hardness of the first polishing pad.

4. The method of claim 1, wherein a roughness of the second polishing pad is lower than a roughness of the first polishing pad.

5. The method of claim 1, wherein a dresser used in the second chemical mechanical polishing process has a circular or donut-shaped profile.

6. The method of claim 5, wherein a removal rate of the dresser used in the second chemical mechanical polishing process is higher than a removal rate of a dresser used in the first chemical mechanical polishing process.

7. The method of claim 1, wherein a concentration of abrasive particles of a second slurry used in the second chemical mechanical polishing process is lower than a concentration of abrasive particles of a first slurry used in the first chemical mechanical polishing process.

8. The method of claim 7, wherein the abrasive particles of the second slurry include silicon oxide, aluminum oxide, cerium oxide or combinations thereof.

9. The method of claim 1, further comprising:
    forming a second interconnect above the second dielectric layer;
    forming a third dielectric layer on the second interconnect; and
    performing a third chemical mechanical polishing process on the third dielectric layer, to planarize the third dielectric layer,
    wherein the depth of the second grooves of the second polishing pad used in the second chemical mechanical polishing process is smaller than a depth of third grooves of a third polishing pad used in the third chemical mechanical polishing process.

10. The method of claim 9, wherein a porosity of the second polishing pad is lower than a porosity of the third polishing pad.

11. The method of claim 9, wherein a hardness of the second polishing pad is higher than a hardness of the third polishing pad.

12. The method of claim 9, wherein a removal rate of a dresser used in the second chemical mechanical polishing process is higher than a removal rate of a dresser used in the third chemical mechanical polishing process.

13. The method of claim 9, wherein a concentration of abrasive particles of a second slurry used in the second chemical mechanical polishing process is lower than a concentration of abrasive particles of a third slurry used in the third chemical mechanical polishing process.

14. The method of claim 9, further comprising:
    forming a trench in the substrate;
    forming an insulating layer in the trench;
    performing a fourth chemical mechanical polishing process on the insulating layer, to planarize the insulating layer and form a shallow trench isolation structure,
    wherein the depth of the second grooves of the second polishing pad used in the second chemical mechanical polishing process is smaller than a depth of fourth grooves of a fourth polishing pad used in the fourth chemical mechanical polishing process.

15. The method of claim 14, wherein a porosity of the second polishing pad is lower than a porosity of the fourth polishing pad.

16. The method of claim 14, wherein a hardness of the second polishing pad is higher than a hardness of the fourth polishing pad.

17. The method of claim 14, wherein a removal rate of a dresser used in the second chemical mechanical polishing process is higher than a removal rate of a dresser used in the fourth chemical mechanical polishing process.

18. The method of claim 14, wherein a concentration of abrasive particles of a second slurry used in the second chemical mechanical polishing process is lower than a concentration of abrasive particles of a fourth slurry used in the fourth chemical mechanical polishing process.

* * * * *